US00RE40855E

(19) United States
(12) Reissued Patent
Rivera et al.

(10) Patent Number: US RE40,855 E
(45) Date of Reissued Patent: Jul. 14, 2009

(54) INTEGRATED CIRCUIT HAVING A REDUCED SPACING BETWEEN A BUS AND ADJACENT CIRCUITRY

(76) Inventors: Billie Jean Rivera, 757 Calero Ave., San Jose, CA (US) 95123; William Gordon Walker, 18640 Woodbank Way, Saratoga, CA (US) 95070

(21) Appl. No.: 11/347,788

(22) Filed: Feb. 2, 2006

(Under 37 CFR 1.47)

Related U.S. Patent Documents

Reissue of:
(64) Patent No.: 6,687,880
Issued: Feb. 3, 2004
Appl. No.: 10/245,794
Filed: Sep. 16, 2002

U.S. Applications:
(60) Provisional application No. 60/323,574, filed on Sep. 19, 2001.

(51) Int. Cl.
*G06F 17/50* (2006.01)

(52) U.S. Cl. ..... 716/1; 716/2; 716/8; 716/9
(58) Field of Classification Search ..... 716/1, 716/2, 4, 5, 8–10
See application file for complete search history.

(56) References Cited

U.S. PATENT DOCUMENTS 4,187,391 A * 2/1980 Voser ..... 174/106 R
5,200,807 A * 4/1993 Eguchi ..... 257/758
5,812,384 A * 9/1998 Ramakrishnan et al. ..... 363/39

* cited by examiner

*Primary Examiner*—Sun J Lin
(74) *Attorney, Agent, or Firm*—Stolowitz Ford Cowger LLP

(57) ABSTRACT

An integrated circuit that reduces spacing between circuitry and a bus. In accordance with this invention, the bus is a strip of conductive material in a layer of the integrated circuit. The layer includes at least one slot that removes conductive material from the bus. The removal of the conductive material in the slot allows the space between circuitry adjacent the bus and the bus to be reduced.

66 Claims, 5 Drawing Sheets

INTEGRATED CIRCUIT HAVING A REDUCED SPACING BETWEEN A BUS AND ADJACENT CIRCUITRY

Matter enclosed in heavy brackets [ ] appears in the original patent but forms no part of this reissue specification; matter printed in italics indicates the additions made by reissue.

CROSS-RELATED

This application is a utility application claiming priority to an earlier filed U.S. Provisional Application No. 60/323,574 filed Sep. 19, 2001.

BACKGROUND OF THE INVENTION

1. Field of the Invention

The present invention relates to integrated circuits. More, particularly, this invention relates to reducing spacing between a bus and adjacent circuits. Still more particularly, this invention relates to defining slots in the bus during design of an integrated circuit to reduce the space needed between the bus and adjacent circuitry.

2. The Prior Art

As the electrical arts advance, the amount of circuitry in an integrated circuit is increasing. Therefore, it is a problem for those that design integrated circuits to maximize the space in an integrated circuit where circuitry can be placed.

Currently, designers of integrated circuits are limited by the spacing requirements between a bus and circuits that are adjacent to the bus in the integrated circuit. For purposes of this discussion, a bus is a strip or line of conductive material which carries signals between circuits and a circuit is any configuration of circuitry that is in the integrated circuit. Also, for purposes of this discussion, conductive material is a metal or other type of substance having properties that allow transmission of electric signals.

The present design process requires a designer to place a solid strip of conductive material in a layer of the integrated circuit. The designer must than use the properties of the solid strip of conductive material to determine the spacing between the strip and a circuit that is adjacent to the strip. The designer then places the circuit adjacent to the bus with the determined amount of spacing separating the circuit from the bus.

Figure 1:
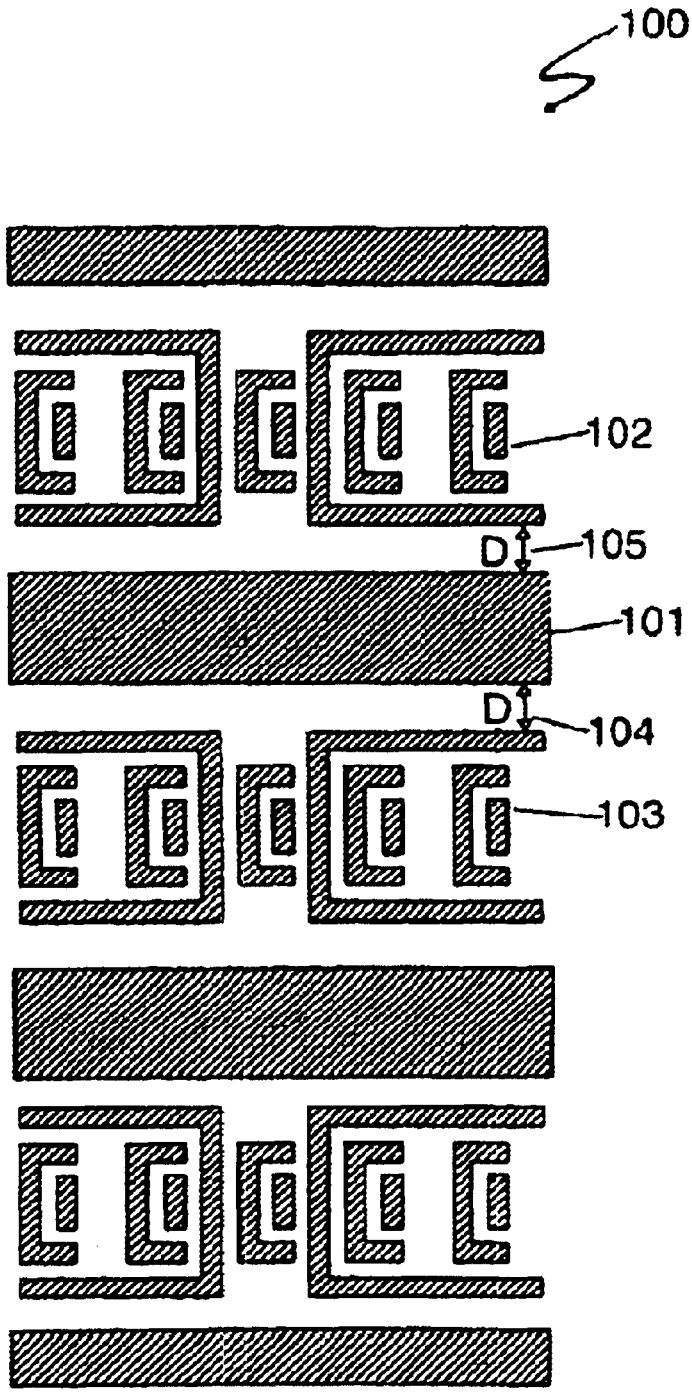
FIG. 1 PRIOR ART

FIG. 1 illustrates the above-described configuration. In layer 100 of an integrated circuit, a bus 101 is a solid strip of conductive material. Circuit 102 and circuit 103 are adjacent to bus 101 on opposite sides of bus 101. Circuit 102 and circuit 103 are both separated by distance D, represented by arrows 104 and 105, from bus 101. Distance D is determined from the width of bus 101. The width of bus 101 is used to determine the density of the conductive material in bus 101 which dictates the distance D of separation that must be maintained by the bus and an adjacent circuit.

After the circuit is designed with the bus made of a solid strip of conductive material. The design is provided to the manufacturer. The manufacturer then cuts slots into the strip of conductive material of the bus. The slots remove conductive material to change the density of conductive material in the bus and make the bus more manufacturable.

Figure 2:
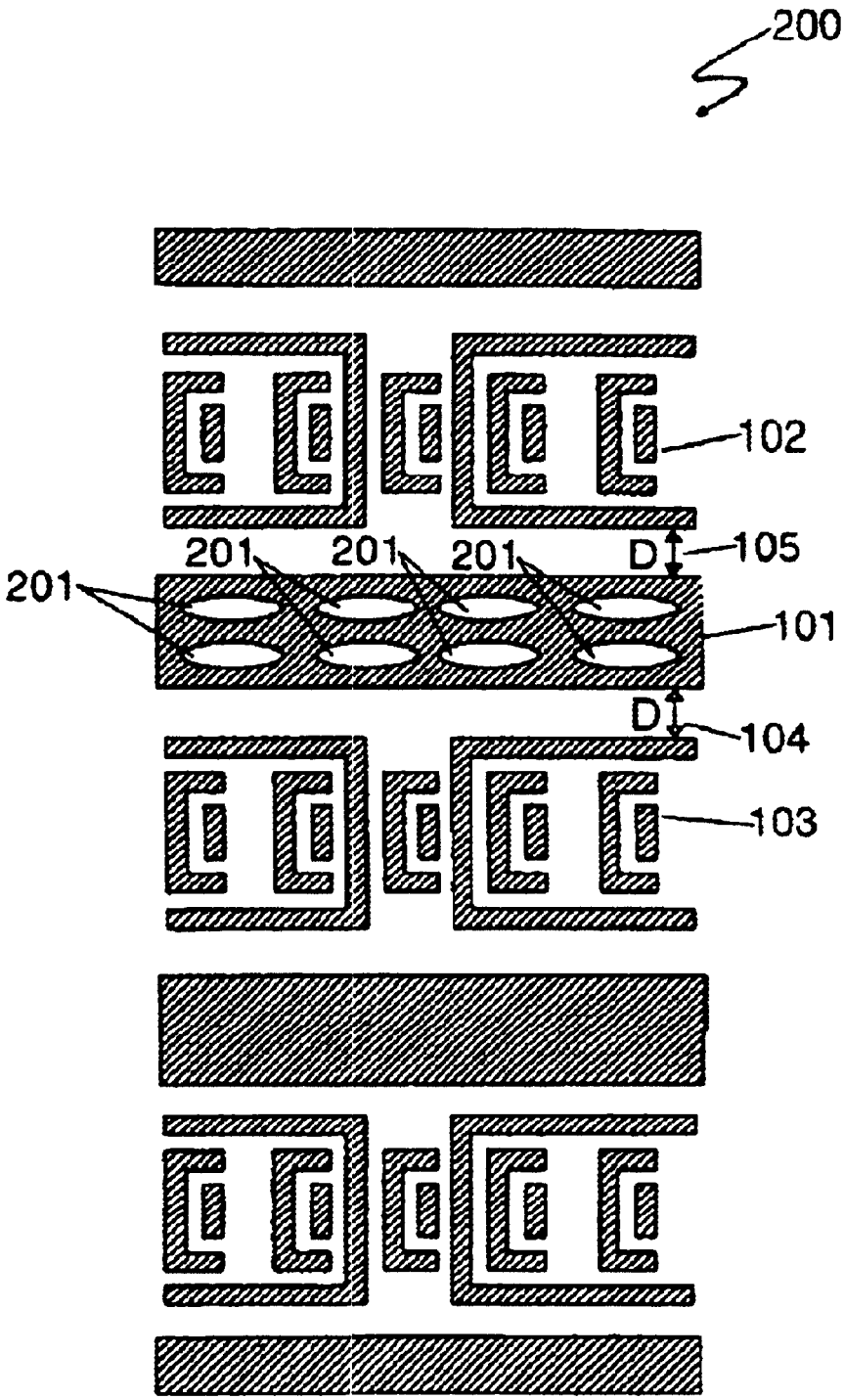
FIG. 2 PRIOR ART

FIG. 2 illustrates a layer 200 of integrated circuit after the routing is completed in the manufacturing process. In layer 200, bus 100 is a strip of conductive material that has slots 201 in the strip. Each slot 201 is devoid of conductive material. The slots change the amount of conductive material in the strip, which in turn changes the density of the material. However, the distance, D, between the bus and adjacent circuits 102,103 has not been changed. Therefore, circuits 102 and 103 are further away from the bus than is needed.

BRIEF DESCRIPTION OF THE INVENTION

This patent discloses and claims a useful, novel, and unobvious invention for an integrated circuit with reduced separation between a bus and adjacent circuits. In accordance this invention, slots are put into a strip of conductive material of a bus to reduce the amount of conductive material in the bus. The addition of the slots is performed during the design of the integrated circuit as opposed to during a post design step.

The addition of the slots into the strip of conductive material of the bus during the design process offers many advantages. A first advantage is that since the final density of conductive material in the bus is known at design time, the spacing between the bus and adjacent circuits maybe reduced. A second advantage is that since the position of the slots is known to the designer at design time, a designer may avoid placing connectors to other circuits over slots causing a disconnect.

In accordance with the present invention a layer of an integrated circuit has a first circuit in the layer and a bus in the layer. The bus is adjacent to the first circuit. The bus is a strip of conductive material with at least one slot defined in the strip. The slot removes conductive material from the strip to allow a reduction of spacing between the bus and the first circuit. The other configurations of this integrated circuit are described below.

In order to provide the integrated circuit described above, an integrated circuit is designed in the following manner. First, a strip of conductive material acting as a bus is placed in a first layer of the integrated circuit. Slots are then defined in the conductive material of the strip to remove conductive material in the strip. The spacing between the bus and an adjacent circuit is then determined from the amount of conductive material in the strip after the slots have been made. A circuit is then placed adjacent to the bus with the amount of separation determined by the amount of conductive material in the strip.

BRIEF DESCRIPTION OF THE DRAWING FIGURES

Figure 3:
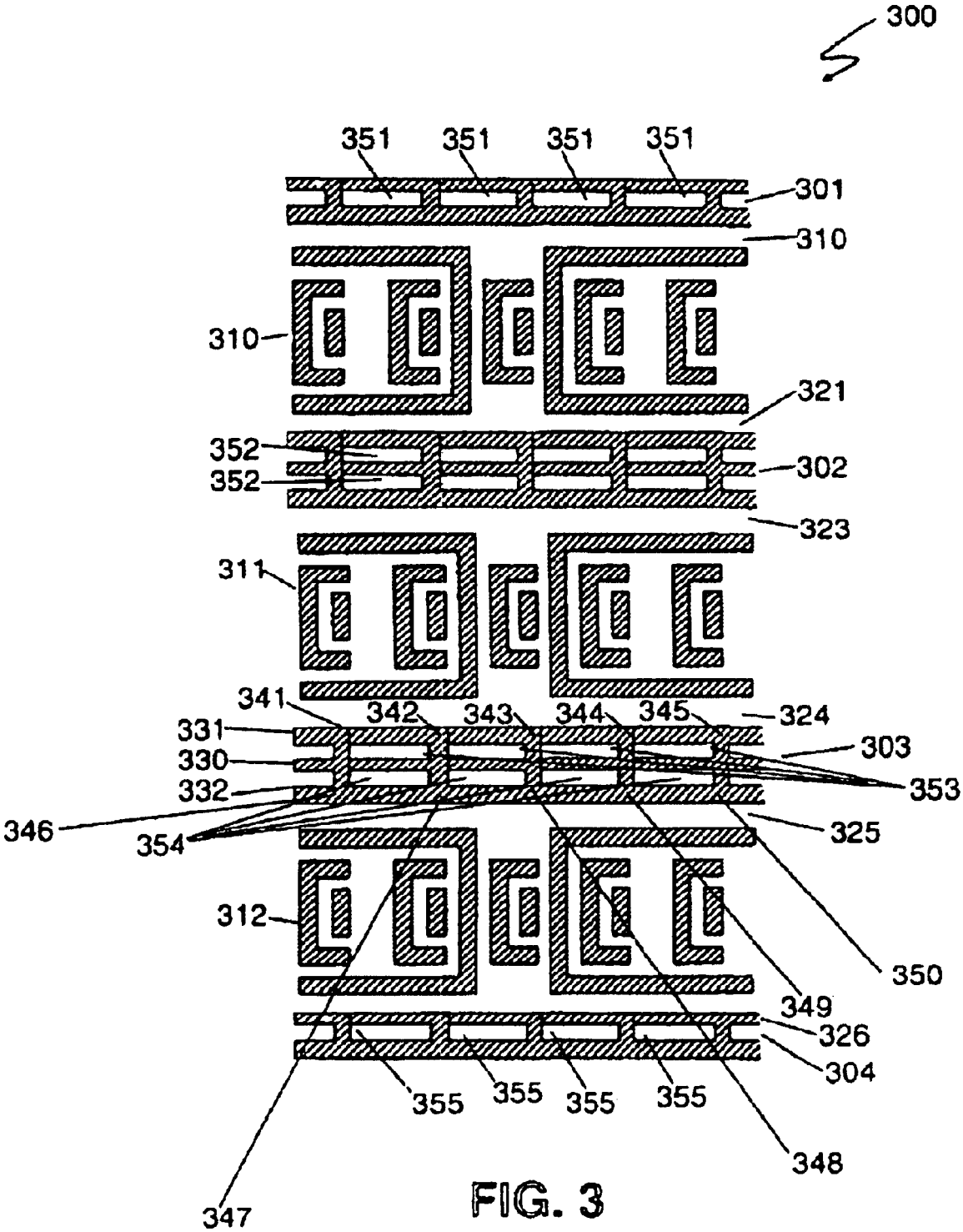
Figure 4:
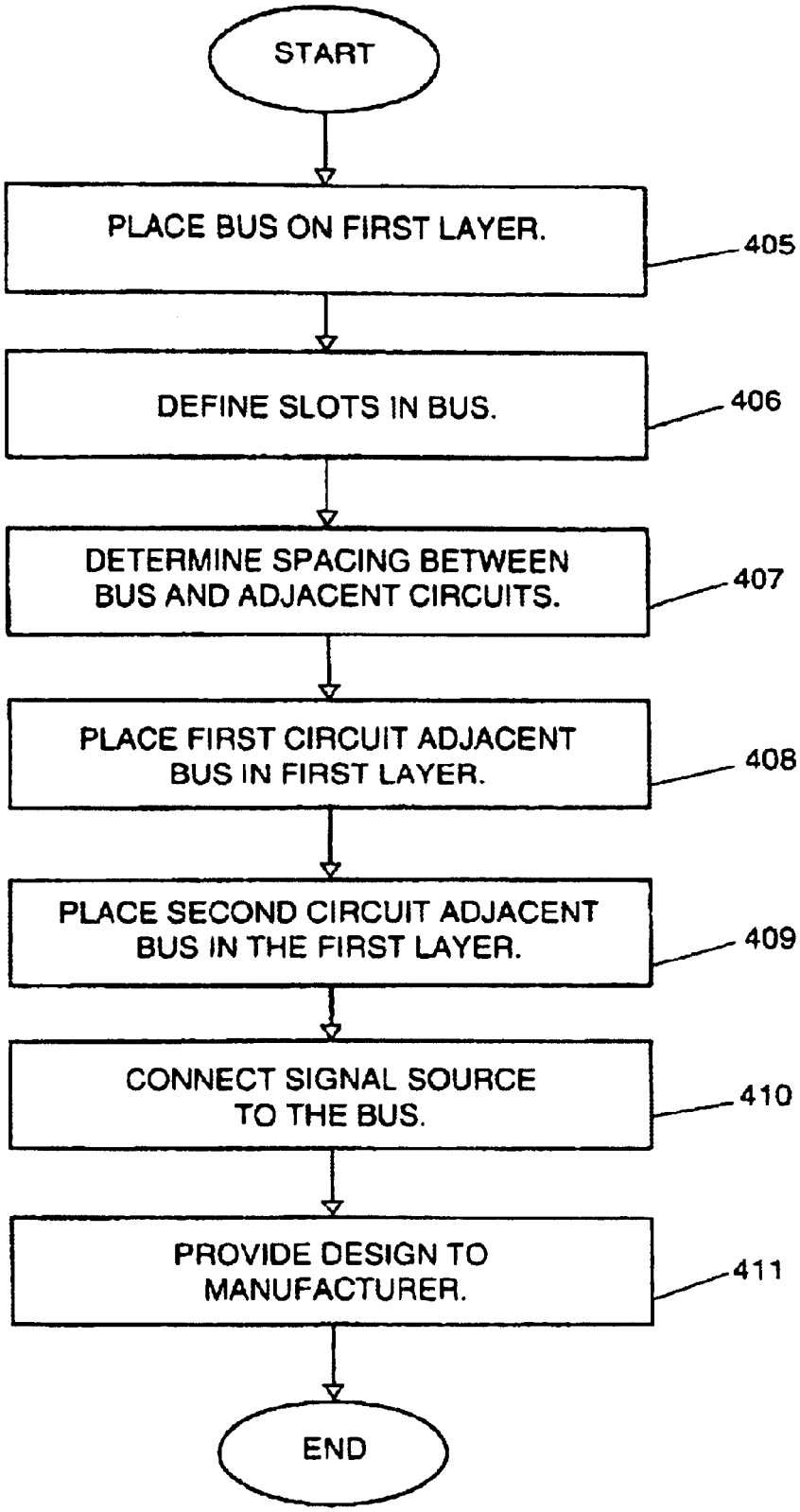
Figure 5:
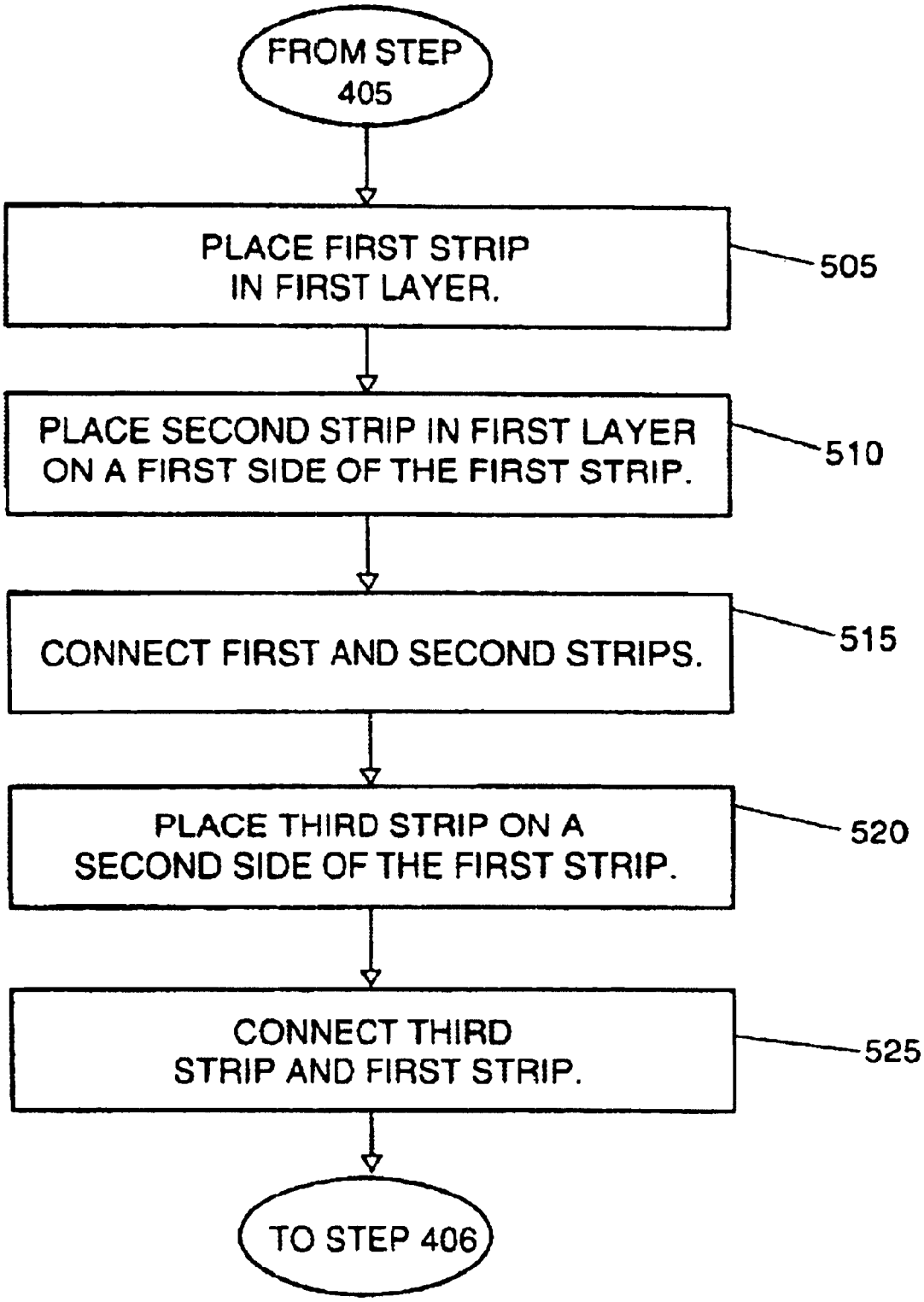

The above and other advantage and features in accordance with this invention are described in the detailed description and shown in the following drawings:

FIG. 1 illustrating a diagram of a prior art layer of an integrated circuit after the design process;

FIG. 2 illustrating a diagram of a prior art layer of an integrated circuit after processing by a manufacturer;

FIG. 3 illustrating a diagram of a layer of an integrated circuit in configured in accordance with this invention;

FIG. 4 illustrating a flow diagram of a process for designing an integrated circuit in accordance with this invention;

FIG. 5 illustrating a flow diagram for a process of placing a bus in a layer of an integrated circuit and defining slots in the bus in accordance with this invention.

DETAILED DESCRIPTION OF THE INVENTION

The following description of embodiments of this invention is not intended to limit the scope of the invention to the shown embodiments, but rather to enable any person skilled in the art of to make and use this invention.

FIG. 3 illustrates a layer 300 of an integrated circuit configured in accordance with this invention. Layer 300 includes busses 301–304. Each of busses 301–304 may be a signal bus for transmitting electrical current between circuits or may be a power bus for supplying electrical current to a circuit. One skilled in the art will recognize that the type of bus does not matter as the concepts of this invention may be applied to any type of bus.

Each of busses 301–304 has at least one circuit 310–312 adjacent at least one side of the bus. One skilled in the art will recognize that exact configuration or function of each circuit 310–312 is not essential to understanding this invention and has been omitted for brevity. Each of the buses 301–304 is a strip of conductive material in layer 300. In a preferred embodiment, conductive material is a metal, such as copper. However, one skilled in the art will recognize that other metals or other conductive materials may be used. Each bus also has at least one slot 351–355 in the bus. Each slot is an area where the conductive material of the strip has been removed. The removal of the conductive material changes the amount of material in the strip of each of the busses 301–304. Thus, the density of conductive material in each bus is reduced. One skilled in the art will recognize that the change in density of the conductive material changes impedance of the material. This in turn changes the amount of space required between a circuit and the bus in order to prevent the current on the bus from interfering with current flowing through the circuit. One skilled in the art will recognize that there are many commonly available methods and equations for determining the impedance of the conductive material that are commonly available in various text books and other related materials. This allows the distances, D, of areas 320–325 between circuits 310–312 and adjacent ones of busses 301–304 to be reduced.

The determination of the spacing between a side of one the busses 301–304 and an adjacent circuit is calculated from the density or amount of conductive material in the bus. Typically, there are design rules which are well known in the art which govern the minimal distance needed between the bus and adjacent circuitry based upon the density of conductive material in the bus.

Bus 303 is now described in detail. One skilled in the art will recognize that other bus 301,302 and 304 are configured in the same manner and descriptions of each are omitted for brevity. Bus 303 has a first center strip 330 of conductive material in first layer 300. Second strip 331 of conductive material is adjacent first center strip 330 on a first side of first center strip 330. Second strip 331 is substantially parallel to first center strip 330.

Cross connect strips 341–345 connect first center strip 330 and second strip 331. Preferably, cross connect strips 341–345 are substantially perpendicular to first center strip 330 and second strip 331. Cross connect strips 341–345 are also preferably spaced evenly apart from one another.

Slots 353 are defined by cross connect strips 341–345. Slots 353 are the spaces between adjacent cross connect strips 341–345, the first side of first center strip 330 and the side of second strip 331 opposing the first side of first center strip 330. Preferably, slots 353 are space evenly apart from one another by cross connect strips 341–345. Slots 353 are also preferably have the same area as one another. Each slot 353 also is an area of non-conductive material such as the material used as the substrate for first layer 300.

In addition to second strip 331, a third strip 332 may be placed in first layer 300 on a second side of first center strip 330 which is opposite of the first side of first center strip 330. Third strip 332 is adjacent first center strip 330 and substantially parallel to first center strip 330.

Cross connect strips 346–350 connect first center strip 330 and third strip 332. Preferably, cross connect strip 346–350 are substantially perpendicular to first center strip 330 and third strip 332. Cross connect strips 346–350 are also preferably substantially parallel to one another. Cross connect strips 346–350 are also preferably spaced evenly apart from one another. Furthermore, each cross connect strip 346–350 also connects third strip 332 to first center strip 330 at the same point a corresponding cross connect strip 341–345 connects second strip 331 to first center strip 330. Those skilled in the art will recognize that this gives bus 343 a flip-flop and abutting configuration. One skilled in the art will also recognize that any additional number of busses may be connected in a flip flop and abutting manner using an outer strip, such as strips 331–332 shown, as the center strip.

Slots 354 are defined by cross connect strips 346–350. Slots 354 are the spaces between adjacent cross connect strips 346–350, the second side of first center strip 330 and the side of second strip 332 opposing the first side of first center strip 330. Preferably, slots 354 are space evenly apart from one another by cross connect strips 346–350. Slots 354 are also preferably have the same area as one another. Furthermore, each slot 354 is at the same point along first center strip 330 as a corresponding one of slots 353 on the other side of first center strip 330. Each slot 354 also is an area of non-conductive material such as the material used as the substrate for first layer 300.

A signal source (Not shown) is connected to bus 303. The signal source is connected via a connector that connects to conductive material in the bus and not a slot where there is no conductive material. Preferably, each of strips 330–332 is connected to the signal source. The signal source may be on first layer 300 or on a second layer of the integrated circuit. One skilled in the art will recognize that the signal source may be a power supply or a circuit that generates a signal.

FIG. 4 is a flow chart of a process 400 for designing an integrated circuit in accordance with this invention. One skilled in the art will recognize that the order that the steps of process 400 are completed may be changed without diverting from concepts of this invention. One skilled in the art will also recognize that this process relates to placing a bus and circuitry onto a layer of an integrated circuit and does not include the steps of designing and laying out the components of a circuit.

Process 400 begins in step 405 with placing a bus in the first layer. The width of the bus may vary depending on the amount of current that the bus needs to carry. A preferred method for placing the bus in the first layer is given in process 500 of FIG. 5. In step 406, at least one slot is defined in the bus. The number and size of the slot slots may be determined by the amount of conductive material that is needed in the bus for resistance and current requirements of the bus. A preferred process for defining the slots is also shown in FIG. 5.

In step 407, the amount of spacing needed between the bus and adjacent circuitry to ensure proper functioning is determined. The amount of spacing required is determined by density of the conductive material in the bus. Alternatively, the amount of spacing is determined from the amount of conductive material in the bus. In a preferred embodiment, there is a set of rules that provides the amount of spacing needed based upon the conductive material in the bus. Alternatively, the spacing may be calculated.

In step 408, a first circuit is placed adjacent to the bus on a first side of the bus. The space calculated in step 407 is used to separate the first circuit from the bus. In step 409, a second circuit is placed adjacent to the bus on a second side of the bus opposite of the first side. The space calculated in step 407 is used to separate the second circuit from the bus.

In step 410, the signal source is connected to the bus. As stated above, the signal source is connected to the bus in a position along the bus having conductive material and not in an area of a slot. Also, the signal source may be connected to each strip in the bus as described above. After the signal source is connected, the design may be provided to a manufacturer or other post design user in step 411. Then, process 400 ends.

FIG. 5 illustrates a preferred process 500 for providing the bus and defining the slots for steps 405 and 406 of process 400. Process 500 begins in step 505 by placing a first strip of conductive material in the first layer. In step 510, a second strip of conductive material is then placed in the first layer adjacent to the first strip on a first side of the first strip. The second strip is preferably substantially parallel to the first strip.

In step 520, a third strip of conductive material is then placed in the first layer adjacent to the first strip on a second side of the first strip adjacent opposite of the first side. The third strip is preferably substantially parallel to the first strip.

In step 520, a third strip of conductive material is then placed in the first layer adjacent to the first strip on a second side of the first strip adjacent opposite of the first side. The third strip is preferably substantially parallel to the first strip.

In step 525, cross connect strips are placed in the first layer to connect the first strip to the third strip. The cross connect strips are preferably placed even distances apart from one another. This defines slots that have substantially equal distance from one another. The cross connect strips also have substantially equal widths that provide uniform spacing of the slots. The cross connect strips are also preferably placed substantially perpendicular to the first and third strips. Each cross connect strip between the first and third strip connects the third strip to the first strip at the same point along the first strip as a corresponding one of the cross connect strips between the first and second strips. This creates a flip-flop and abutting configuration. One skilled in the art will recognize any number of additional strips may be added to the bus in a like manner using the second or third strips as a first strip. Process 500 then ends.

As any person skilled in the art of circuit design will recognize from the previous description and from the figures and claims, modifications and changes can be made to the preferred embodiments of the invention without departing from the scope of the invention defined in the following claims.

What is claimed is:

1. An integrated circuit that minimizes spacing between circuitry comprising:

a first circuit in a first layer of said integrated circuit; and a bus in said first layer of said integrated circuit adjacent said first circuit wherein said bus includes a strip of conductive material with at least one slot defined in said strip of conductive material to remove conductive material from said strip to allow a reduction of spacing between said bus and said first circuit wherein spacing between said bus and an adjacent circuit is determined based upon an amount of said conductive material in said strip of conductive material of said bus.

2. The integrated circuit of claim 1 further comprising:

a second circuit in said first layer of said integrated circuit adjacent to said bus on a side of said bus opposite said first circuit wherein spacing between said bus and said second circuit is reduced because of said removal of conductive material in said at least one slot.

3. The integrated circuit of claim 1 wherein said bus is a power bus.

4. The integrated circuit of claim 1 wherein said bus is a signal bus.

5. The integrated circuit of claim 1 wherein said at least one slot defined in said strip of conductive material comprises a plurality of slots defined in said strip of conductive material.

6. The integrated circuit of claim 5 wherein said slots are evenly spaced in said strip of conductive material.

7. The integrated circuit of claim 5 wherein said strip of conductive material comprises:

a first strip of conductive material in said first layer;

a second strips of conductive material in said first layer adjacent and substantially parallel to said first strip wherein said second strip is spaced apart from said first strip; and a first plurality of cross connect strips of conductive material that connect said first strip and said second strip wherein a first plurality of slots are defined between said plurality of cross connect strips.

8. The integrated circuit of claim 7 wherein said first plurality of cross connect strips are substantially perpendicular to said first strip and said second strip.

9. The integrated circuit of 7 wherein said strip of conductive material comprises:

a third strip of conductive material in said first layer that is adjacent to and substantially parallel to said first strip on an opposite side of said first strip of power material from said second strip wherein said third strip is spaced apart from said first strip;

a second plurality of cross connect strips of conductive material the connect said third strip to said first strip wherein a second plurality of slots are defined as spaces between adjacent ones of said second plurality of connect strips.

10. The integrated circuit of claim 9 wherein said second plurality of cross connect strips are substantially perpendicular to said first strip and said third strip.

11. The integrated circuit of claim 9 wherein said second plurality of cross connect strips are spaced evenly apart from one another.

12. The integrated circuit of claim 9 wherein said second strip and said third strip are connected to said first strip by said first and second plurality of cross connect strips at common points in a flip-flop and abutting manner.

13. The integrated circuit of claim 9 further comprising:

a signal source wherein said signal source is connected to each of said first strip, said second strip, and said third strip.

14. The integrated circuit of claim 7 further comprising:

a signal source wherein said signal source is connected to each of said first strip and said second strip.

15. The integrated circuit of claim 1 further comprising:

a signal source in second layer of said integrated circuit; and a connector that connects said signal source to said bus on a portion of conductive material of said strip.

16. The integrated circuit of claim 1 wherein spacing between said bus and an adjacent circuit is determined based upon a density of said conductive material in said bus.

17. A method for providing a design of an integrated circuit that provides minimal spacing between a bus that transmits signal and a circuitry adjacent to said bus, said method comprising:

placing a bus in a first layer of an integrated circuit;

defining at least one slot in said bus to remove excess conductive material from said bus to reduce spacing required between said bus and an adjacent circuit;

determining an amount of spacing between said bus and said first circuit based upon an amount of conductive material in said bus; and placing a first circuit in said first layer adjacent to said bus on a first side of said bus wherein said spacing between said bus and said first circuit is reduced in response to removing excess conductive material from said bus with said slot in said bus.

18. The method of claim 17 further comprising:

determining an amount of spacing between said bus and said first circuit is determined based upon a density of said conductive material in said bus.

19. The method of claim 17 further comprising:

placing a second circuit in said first layer adjacent to said bus on a second side of said bus opposite of said first side wherein spacing between said bus and said second circuit is reduced in response to removing excess conductive material from said bus with said slot in said bus.

20. The method of claim 19 further comprising:

determining an amount of spacing between said bus and said second circuit based upon an amount of conductive material in said bus.

21. The method of claim 19 further comprising:

determining an amount of spacing between said bus and said second circuit is determined based upon a density of said conductive material in said bus.

22. The method of claim 17 wherein said step of defining said at least one slot:

defining a plurality of slots in said strip of conductive material.

23. The method of claim 22 wherein said step of defining said plurality of slots comprises:

evenly spacing each of said plurality of slots in said strip of conductive material.

24. The method of claim 22 wherein said step of placing said bus comprises:

placing a first strip of conductive material in said first layer;

placing a second strip of conductive material in said first layer adjacent and substantially parallel to said first strip wherein said second strip is spaced apart from said first strip; and connecting said first strip and said second strip with a first plurality of cross connect strips of conductive material in said first layer wherein a first plurality of slots are defined between said plurality of cross connect strips.

25. The method of claim 24 wherein said step of placing said bus further comprises:

aligning said plurality of cross connect strips substantially perpendicular to said first strip and said second strip.

26. The method of 24 said step of placing said bus further comprises:

placing a third strip of conductive material in said first layer adjacent and substantially parallel to said first strip on an opposite side of said first strip of power material from said second strip wherein said third strip is spaced apart from said first strip; and connecting said third strip to said first strip with a second plurality of cross connect strips of conductive material wherein a second plurality of slots are defined as spaces between adjacent ones of said second plurality of connect strips.

27. The method of claim 26 wherein said step of connecting said first step and said third strip comprises:

placing said second plurality of cross connects strips substantially perpendicular to said first strip and said third strip.

28. The method of claim 26 wherein step of connecting said first strip and said third strip further comprises:

spacing said second plurality of cross connect strips evenly apart from one another.

29. The method of claim 26 further comprising:

connecting said second strip and said third strip to said first strip by said first and second plurality of cross connect strips at common points in a flip-flop and abutting manner.

30. The method of claim 26 further comprising;

connecting a signal source to each of said first strip, said second strip, and said third strip.

31. The method of claim 24 further comprising:

connecting a signal source to each of said first strip, and said second strip.

32. The method of claim 17 further comprising:

connecting a signal source in second layer of said integrated circuit in a portion of conductive material of said strip.

33. The method of claim 17 further comprising:

providing said design of said integrated circuit to a manufacturer.

*34. An integrated circuit comprising:*

*a first circuit formed in a first layer of said integrated circuit; and*

*a bus formed in said first layer of said integrated circuit adjacent said first circuit, said bus including a strip of conductive material with at least one slot formed therein to allow a reduction of spacing between said bus and said first circuit, wherein said spacing between said bus and said first circuit is determined based, at least in part, upon an amount of said conductive material in said strip of conductive material of said bus.*

*35. The integrated circuit of claim 34, and further comprising:*

*a second circuit in said first layer of said integrated circuit adjacent to said bus on a side of said bus opposite said first circuit, wherein said at least one slot allows a reduction in spacing between said bus and said second circuit.*

*36. The integrated circuit of claim 34, wherein said bus comprises a power bus.*

*37. The integrated circuit of claim 34, wherein said bus comprises a signal bus.*

*38. The integrated circuit of claim 34, wherein said at least one slot formed in said strip of conductive material comprises a plurality of slots formed in said strip of conductive material.*

*39. The integrated circuit of claim 38 wherein said slots are evenly spaced in said strip of conductive material.*

*40. The integrated circuit of claim 38, wherein said strip of conductive material comprises:*

*a first strip of conductive material in said first layer;*

*a second strip of conductive material in said first layer adjacent and substantially parallel to said first strip, said second strip being spaced apart from said first strip; and*

*a first plurality of cross connect strips of conductive material that connect said first strip and said second strip, wherein a first plurality of slots are formed between said plurality of cross connect strips.*

*41. The integrated circuit of claim 40, wherein said first plurality of cross connect strips are substantially perpendicular to said first strip and said second strip.*

*42. The integrated circuit of 40, wherein said strip of conductive material comprises:*

*a third strip of conductive material in said first layer that is adjacent to and substantially parallel to said first strip on an opposite side of said first strip of power material from said second strip, said third strip being spaced apart from said first strip;*

*a second plurality of cross connect strips of conductive material to connect said third strip to said first strip, wherein a second plurality of slots are defined as spaces between adjacent ones of said second plurality of connect strips.*

*43. The integrated circuit of claim 42, wherein said second plurality of cross connect strips are substantially perpendicular to said first strip and said third strip.*

*44. The integrated circuit of claim 42, wherein said second plurality of cross connect strips are spaced substantially evenly apart from one another.*

*45. The integrated circuit of claim 42, wherein said second strip and said third strip are connected to said first strip by said first and second plurality of cross connect strips at common points in a flip-flop and abutting manner.*

*46. The integrated circuit of claim 42, and further comprising:*

*a signal source connected to at least one of said first strip, said second strip, and/or said third strip.*

*47. The integrated circuit of claim 40, and further comprising:*

*a signal source connected to at least one of said first strip and/or said second strip.*

*48. The integrated circuit of claim 34, and further comprising:*

*a signal source in second layer of said integrated circuit; and*

*a connector to connect said signal source to said bus on a portion of conductive material of said strip.*

*49. The integrated circuit of claim 34, wherein spacing between said bus and an adjacent circuit is determined based, at least in part, upon a density of said conductive material in said bus.*

*50. A method for providing a design of an integrated circuit, said method comprising:*

*defining a bus in a first layer of an integrated circuit;*

*defining at least one slot in said bus to enable a reduction in spacing between said bus and an adjacent circuit;*

*determining an amount of spacing between said bus and said adjacent circuit based, at least in part, upon an amount of conductive material in said bus; and*

*defining a first circuit in said first layer adjacent to said bus on a first side of said bus, wherein said spacing between said bus and said first circuit is reduced in response to removal of conductive material from said bus.*

*51. The method of claim 50, and further comprising:*

*determining an amount of spacing between said bus and said first circuit is determined based, at least in part, upon a density of said conductive material in said bus.*

*52. The method of claim 50, and further comprising:*

*placing a second circuit in said first layer adjacent to said bus on a second side of said bus opposite of said first side, wherein spacing between said bus and said second circuit is reduced in response to removing excess conductive material from said bus with said slot in said bus.*

*53. The method of claim 52, and further comprising:*

*determining an amount of spacing between said bus and said second circuit based, at least in part, upon an amount of conductive material in said bus.*

*54. The method of claim 52, and further comprising:*

*determining an amount of spacing between said bus and said second circuit is determined based, at least in part, upon a density of said conductive material in said bus.*

*55. The method of claim 50, wherein said defining said at least one slot further comprises:*

*defining a plurality of slots in said strip of conductive material.*

*56. The method of claim 55 wherein said defining said plurality of slots further comprises:*

*evenly spacing said plurality of slots in said strip of conductive material.*

*57. The method of claim 55, wherein said defining said bus further comprises:*

*defining a first strip of conductive material in said first layer;*

*defining a second strip of conductive material in said first layer adjacent and substantially parallel to said first strip wherein said second strip is spaced apart from said first strip; and*

*connecting said first strip and said second strip with a first plurality of cross connect strips of conductive material in said first layer wherein a first plurality of slots are defined between said plurality of cross connect strips.*

*58. The method of claim 57, wherein said defining said bus further comprises:*

*defining said plurality of cross connect strips to be substantially perpendicular to said first strip and said second strip.*

*59. The method of 57, said defining said bus further comprises:*

*defining a third strip of conductive material in said first layer adjacent and substantially parallel to said first strip on an opposite side of said first strip of power material from said second strip, said third strip being spaced apart from said first strip; and*

*defining a second plurality of cross connect strips of conductive material to connect said third strip to said first strip, wherein a second plurality of slots are defined as spaces between adjacent ones of said second plurality of connect strips.*

*60. The method of claim 59, wherein said defining said second plurality of cross connect strips of conductive material further comprises:*

*defining said second plurality of cross connect strips to be substantially perpendicular to said first strip and said third strip.*

*61. The method of claim 59, wherein said defining said second plurality of cross connect strips of conductive material further comprises:*

*spacing said second plurality of cross connect strips substantially evenly apart from one another.*

*62. The method of claim 59, and further comprising:*

*defining connection of said second strip and said third strip to said first strip by said first and second plurality of cross connect strips at common points in a flip-flop and abutting manner.*

*63. The method of claim 59, and further comprising:*

*defining connection of a signal Source to at least one of said first strip, said second strip, and/or said third strip.*

*64. The method of claim 57, and further comprising:*

*defining connection of a signal source to at least one of said first strip, and/or said second strip.*

*65. The method of claim 50, and further comprising:*

*defining connection of a signal source in a second layer of said integrated circuit to a portion of conductive material of said strip.*

*66. The method of claim 50, and further comprising:*

*providing said design of said integrated circuit to a manufacturer.*

* * * * *

UNITED STATES PATENT AND TRADEMARK OFFICE

CERTIFICATE OF CORRECTION

PATENT NO. : RE40,855 E
APPLICATION NO. : 11/347788
DATED : July 14, 2009
INVENTOR(S) : Billie Jean Rivera et al.

It is certified that error appears in the above-identified patent and that said Letters Patent is hereby corrected as shown below:

At column 6, line 19, Claim 7, delete “strips” and insert -- strip --.

At column 6, line 30, Claim 9, delete “of 7” and insert -- of claim 7 --.

At column 6, line 39, Claim 9, delete “the connect” and insert -- that connect --.

At column 7, line 61, Claim 26, delete “of 24” and insert -- of claim 24 --.

At column 8, line 8, Claim 27, delete “connects” and insert -- connect --.

At column 8, line 19, Claim 30, delete “comprising;” and insert -- comprising: --.

At column 9, line 8, Claim 42, delete “of 40,” and insert -- of claim 40, --.

At column 10, line 44, Claim 59, delete “of 57,” and insert -- of claim 57, --.

Signed and Sealed this
Fifteenth Day of March, 2011

David J. Kappos

David J. Kappos
*Director of the United States Patent and Trademark Office*